US007990235B1

(12) United States Patent
Yew et al.

(10) Patent No.: US 7,990,235 B1
(45) Date of Patent: Aug. 2, 2011

(54) SIMULTANEOUS SWITCHING NOISE FILTER ARCHITECTURE AND METHOD

(75) Inventors: Yee Huan Yew, Bayan Lepas (MY); Hong Shi, Santa Rosa, CA (US)

(73) Assignee: Altera Corporation, San Jose, CA (US)

( * ) Notice: Subject to any disclaimer, the term of this patent is extended or adjusted under 35 U.S.C. 154(b) by 387 days.

(21) Appl. No.: 12/128,581

(22) Filed: May 28, 2008

Related U.S. Application Data

(60) Provisional application No. 60/970,220, filed on Sep. 5, 2007.

(51) Int. Cl.
*H01P 1/203* (2006.01)
*H03H 7/09* (2006.01)

(52) U.S. Cl. ........................................ 333/204; 333/185

(58) Field of Classification Search .................... 333/33, 333/34, 166–168, 175, 176, 185, 202–205, 333/246
See application file for complete search history.

(56) References Cited

U.S. PATENT DOCUMENTS

| | | | | | |
|---|---|---|---|---|---|
| 5,656,872 | A * | 8/1997 | Lee | ................................ | 307/91 |
| 6,621,370 | B1 * | 9/2003 | Dao | ................................ | 333/25 |
| 6,792,299 | B2 * | 9/2004 | Ye | ................................ | 505/210 |
| 2008/0259060 | A1 * | 10/2008 | Lin | ................................ | 345/204 |
| 2009/0269943 | A1 * | 10/2009 | Palli et al. | ........................ | 439/39 |

* cited by examiner

*Primary Examiner* — Benny Lee
*Assistant Examiner* — Gerald Stevens
(74) *Attorney, Agent, or Firm* — Martine Penilla & Gencarella, LLP

(57) ABSTRACT

The present invention is directed to a transmission line assembly and method of propagating signals therethrough that features forming transmission lines of the assembly to provide desired filtering properties. To that end, the assembly includes a plurality of spaced-apart transmission lines placing first and second sets of active circuits in electrical communication, with a subset of the plurality of spaced apart transmission lines having dimensions to filter unwanted characteristics of signals, propagating between the first and second sets and inductively coupled between one or more of the plurality of spaced-apart transmission lines. The method performs the function of the assembly.

18 Claims, 4 Drawing Sheets

SIMULTANEOUS SWITCHING NOISE FILTER ARCHITECTURE AND METHOD

CROSS REFERENCE TO RELATED APPLICATIONS

This application claims priority from U.S. Provisional Patent Application No. 60/970,220, filed Sep. 5, 2007, and entitled "SIMULTANEOUS SWITCHING NOISE FILTER ARCHITECTURE AND METHOD." This provisional application is herein incorporated by reference.

BACKGROUND

The present invention relates to integrated circuit systems and more particularly to filtering techniques to reduce simultaneous switching noise between transmission lines disposed in printed circuit boards (PCBs) and placing integrated circuits in signal communication, referred to as integrated circuit assemblies (ICAs).

During normal operations of the ICAs, close proximity of transmission lines cause inductively coupling of signals between adjacent transmission lines in the presence of a time varying current in one of the same. Inductively coupling of signals, in this manner, is typically referred to simultaneous switching noise (SSN). SSN may interfere with operation of the integrated circuit resulting in faulty operation of the same. As a result, there have been several attempts to reduce switching noise.

An existing technique to reduce SSN employs multiple low-inductance bypass, or decoupling, capacitors. Decoupling capacitors filter noise by "short circuiting" high frequency components of a noise signal and are often connected between each power plane and adjacent ground plane. However, the inclusion of additional components, such as capacitors, results in increased cost of production of ICAs.

A need exist, therefore, to provide improved ICAs manufacturing techniques.

SUMMARY

It should be appreciated that the present invention can be implemented in numerous ways, such as a process and a package. Several inventive embodiments of the present invention are described below.

The present invention is directed to an integrated circuit assembly and method of propagating signals therethrough that features forming transmission lines of the assembly to provide desired filtering characteristics. To that end, the integrated circuit assembly includes first and second sets of active circuits and a plurality of spaced-apart transmission lines placing the first and second set of active circuits in electrical communication. A subset of the plurality of spaced apart transmission lines have dimensions to filter unwanted characteristics of signals propagating between the first and second sets and inductively coupled to one or more of the plurality of spaced-apart transmission lines. An integrated circuit having spaced apart transmission lines with dimensions to filter unwanted characteristics of signals propagating between the first and second sets is provided in another aspect of the invention.

These and other aspects of the invention will become apparent from the following detailed description, taken in conjunction with the accompanying drawings, illustrating by way of example the principles of the invention.

BRIEF DESCRIPTION OF THE DRAWINGS

The present invention can be best understood by reference to the following description taken in conjunction with the accompanying figures, in which like parts may be referred with like numerals.

DETAILED DESCRIPTION OF THE INVENTION

Figure 1:
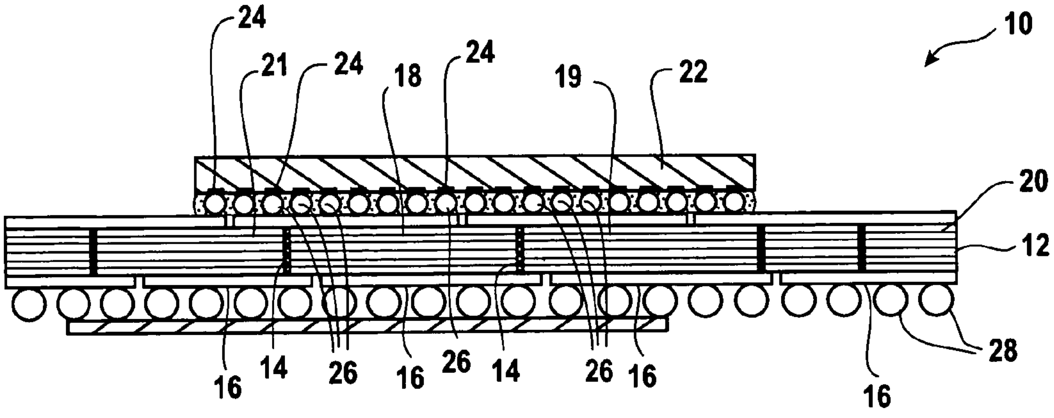
FIG. 1 is a simplified cross-sectional view of an integrated circuit system in accordance with one embodiment of the present invention.

Referring to FIG. 1, an integrated circuit system 10 is shown as including a substrate 12, typically a printed circuit board (PCB) having a plurality of vias 14 and a plurality of conductive transmission lines 18, 19, 20 and 21 disposed upon one side thereof in electrical communication with one or more of vias 14. A plurality of contact pads 16 is disposed on a side of substrate 12 that is opposite to the side upon which conductive transmission lines 18, 19, 20 and 21 are disposed and in electrical communication with one or more of vias 14. Vias 14 place conductive transmission lines 18, 19, 20 and 21 in electrical communication with different subsets of output contact pads 16. Integrated circuit 22 includes a plurality of bonding pads 24 and is mechanically and electrically coupled to substrate 12 by solder bumps 26 disposed between bonding pads 24 and conductive transmission lines 18, 19, 20 and 21, using techniques well known in the art, discussed further below. Signals from integrated circuit 22 are transmitted outside of integrated circuit package 10 by solder bumps 28 that are attached to and in electrical communication with contact pads 16. Solder bumps 28 are also used to place other circuits, such as integrated circuit 30, in electrical communication with integrated circuit 22.

Figure 2:
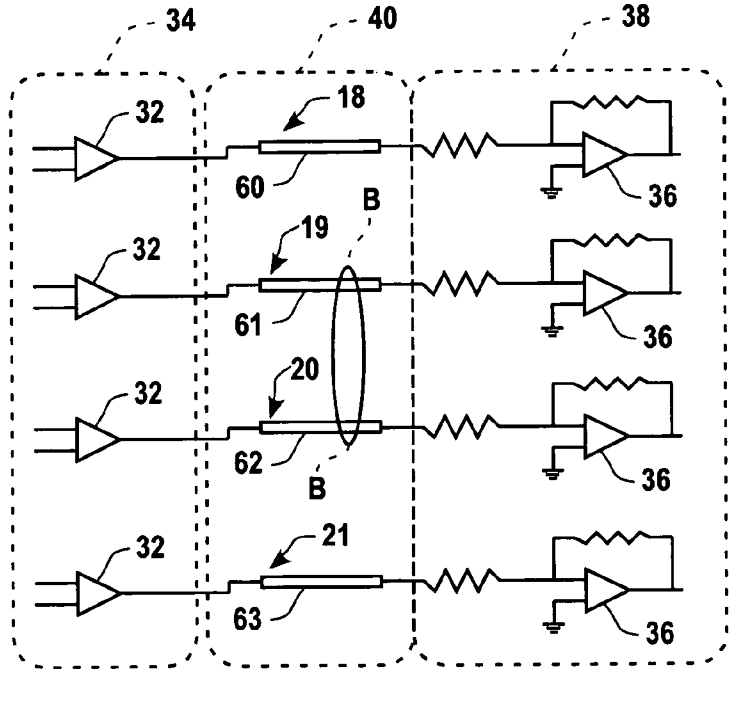
FIG. 2 is a schematic of a portion of the integrated circuit system, shown in FIG. 1, coupled to loads in accordance with the present invention.

Referring to both FIGS. 1 and 2, typically integrated circuit 22 includes a plurality of active circuits 32 defining a first set 34. Integrated circuit 30 includes a plurality of active circuits 36, defining a second set 38. First and second sets 34 and 38 are in electrical communication via a set 40 of transmission lines 18, 19, 20 and 21.

Figure 3:
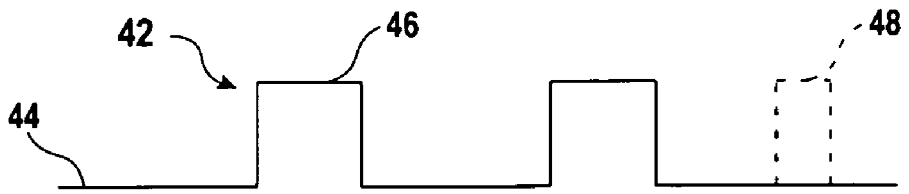
FIG. 3 is simplified graph showing signal propagation along one of the channels shown in FIG. 1.

Referring to both FIGS. 2 and 3, signals, such as signal 42 propagate between first and second seconds 34 and 38 over set 40 of conductive transmission lines 18, 19, 20 and 21. As is well known, the physical proximity of adjacent conductive transmission lines 18, 19, 20 and 21 may attribute to cross-coupling of signals propagating between first and second sets 34 and 38. The cross-coupling results from a change in current flow through one of conductive transmission lines 18, 19, 20 and 21 that occurs as a result of a transition of signal 42 from a logical zero "0" voltage level 44 to a logical "1" voltage level 46. This produces a magnetic field, B, that is shared between one or more adjacent conductive transmission lines 18, 19, 20 and 21 inductively coupling a signal by inducing current flow, referred to as cross-talk or simultaneous switching noise (SSN). SSN presents as an inductively coupled signal 48 on the conductive transmission lines 18, 19, and 21 in which the induced current is present. As the magnitude of inductively coupled signal 48 approaches voltage level 44, active circuit 36 receiving the same may incorrectly identify the same as signal 42. This may be deleterious to the operation of active circuit 36.

Figure 4:
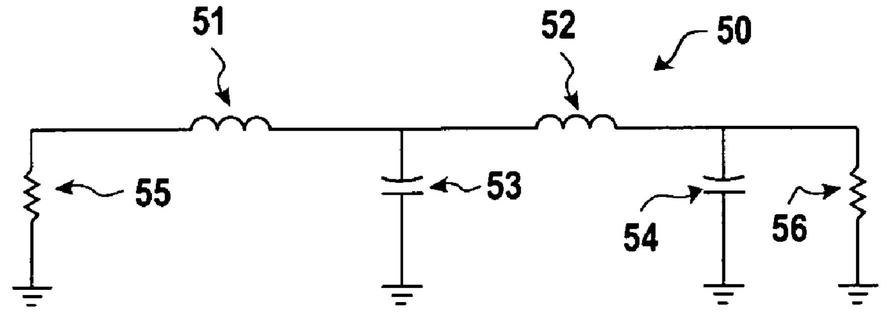
FIG. 4 is a simplified electrical schematic showing a basic filter configuration in accordance with the present invention.

Referring to FIGS. 2, 3 and 4, one manner in which to attenuate the characteristics of inductively coupled signal 48 is to provide an RLC filter 50 that includes inductive components 51 and 52, capacitive components 53 and 54 and resistive components 55 and 56. Inductive components 51 and 52 are connected in series and capacitive components 53 and 54 are connected in parallel between ground and opposed side of inductive component 52. Resistive component 55 is coupled in parallel with capacitive component 53 between ground and opposed sides of inductive component 51, and resistive component 56 is coupled in parallel with capacitive component 54 between ground and a common side of inductive component 52.

Figure 5:
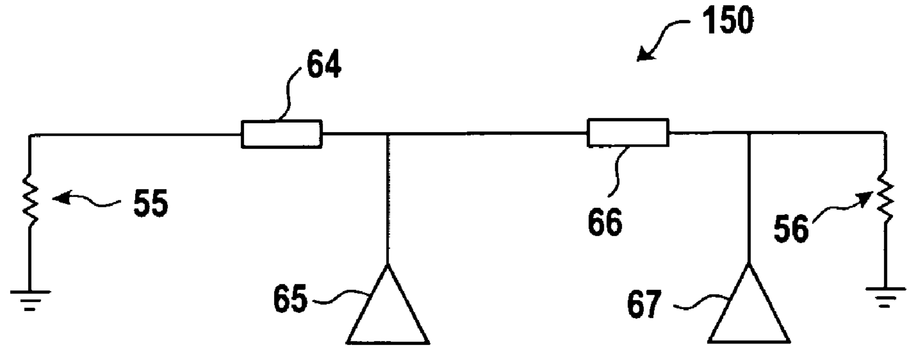
FIG. 5 is a simplified schematic showing the implementation of the electrical functions shown in the electrical schematic of FIG. 4.

To avoid the increased cost associated with including inductive components 51 and 52 and capacitive components 53 and 54 to assembly 10, filter 50 is implemented in assembly 10 by establishing dimensions of conductive transmission lines 18, 19, 20 and 21 to provide desired filtering properties. To that end, each of conductive transmission lines 18, 19, 20 and 21 includes filter segments 60, 61, 62 and 63 that provide the aforementioned filter properties to form a transmission line filter 150, shown in FIG. 5. Transmission line filter 150 includes resistive components 55 and 56 that correspond to the resistance presented by active circuits 32 and 36, respectively, at opposed ends of conductive transmission lines 18, 19, 20 and 21. Inductive components 51 and 52, as well as, capacitive components 53 and 54 have been replaced appropriate dimensions of material from which filter segments 60-63 of conductive transmission lines 18, 19, 20 and 21 are formed, shown as 64, 65, 66 and 67.

The dimensions of segments 60-63 of conductive transmission lines 18, 19, 20 and 21 are configured to provide desired filtering properties. The filtering properties are a function of a coupling component [M], which represents inductively coupling characteristics of adjacent conductive transmission lines 18, 19, 20 and 21 in the presence of a time varying current di/dt associated with signal 42 on one of conductive transmission lines 18, 19, 20 and 21. Specifically, a magnitude of inductive coupled signal 48 V on one of conductive transmission lines 18, 19, 20 and 21 may be expressed as follows:

$$V_m=[M_n]di/dt$$

where $V_m$ is the transmission line upon which signal 48 is present and $M_n$ is the coupling component between the conductive transmission lines 18, 19, 20 and 21 upon which signal 42 and the conductive transmission lines 18, 19, 20 and 21 upon which inductively coupled signal 48 is present. Time varying current di/dt is the change of current present when signal 42 alternates between a logic "0" voltage level 44 and a logic "1" voltage level 46 and vice-versa.

Figure 6:
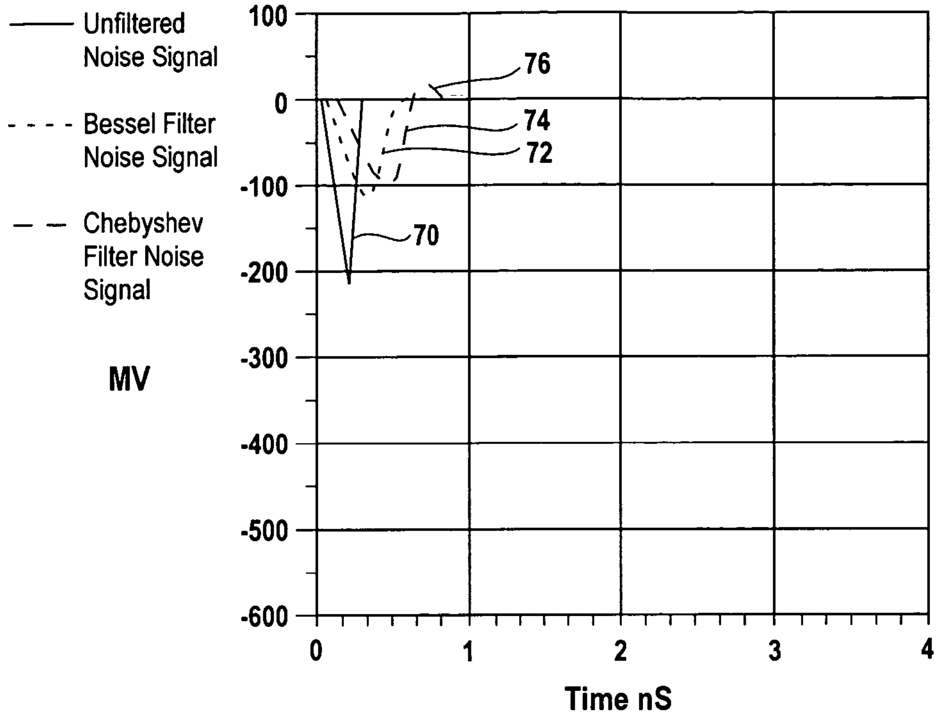
FIG. 6 is a graph comparing the signal noise generated by inductively coupling between transmission lines shown in FIG. 2.
Figure 7:
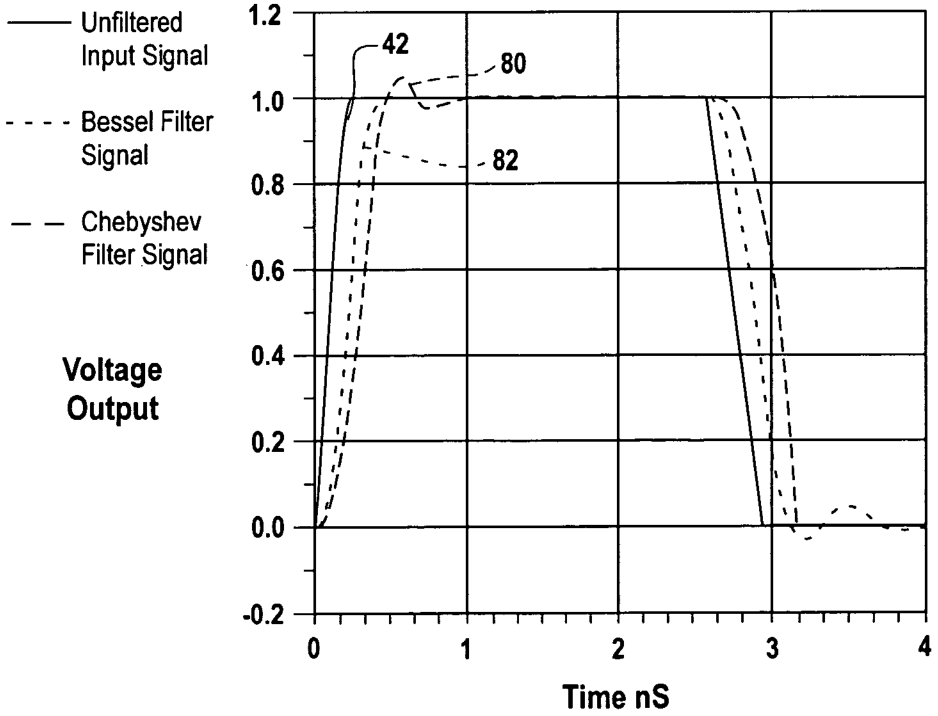
FIG. 7 is a graph comparing the signal output from one of the transmission lines mentioned in FIG. 6.

Referring to FIGS. 2, 6 and 7, it was determined that many different filtering properties may be employed. For example, dimensions of filtering segments 60-63 may be established to provide a Chebyshev filter, a Bessel filter and the like. As shown, a magnitude of an unfiltered inductive coupled signal is shown by curve 70 to be in excess of 200 millivolts. Implementation of Bessel filtering properties in segments 60-63 results in a reduction of noise to a little greater than less than 100 millivolts, shown by curve 72. Implementation of Chebyshev filtering properties in segments 60-63 results in a further reduction of noise to less than 100 millivolts. However, Chebyshev filtering properties results in a distortion 76. This results from the sharp cutoff frequency response of Chebyshev filters. Distortion 76 feeds back to the transmission line and therefore, the signal 42 propagating thereon that produces the SSN represented by curve 74, as shown by signal 80, with a curve 82 representing output from the same transmission line having Bessel filtering properties. As a result, it is desired to provide segments 60-62 with dimensions to provide Bessel filtering properties. For example, it is desired that filtering properties attenuate a bandwidth of inductively coupled signal 48, as measured in the frequency domain, while maintaining the magnitude to be below a threshold voltage associated with the active circuits 36.

In the present example, the threshold voltage is defined as the voltage at which point field effect transistors (not shown) within active circuits 36 begin to operate, e.g., "turn-on". It should be noted that the filtering properties are, therefore, determined based upon the active circuits 36, the parameters of signal 42, the materials from which segments are formed and the parasitic characteristics of coupling active circuits 32 and 36 to set 40 of conductive transmission lines 18, 19, 20 and 21.

Figure 8:
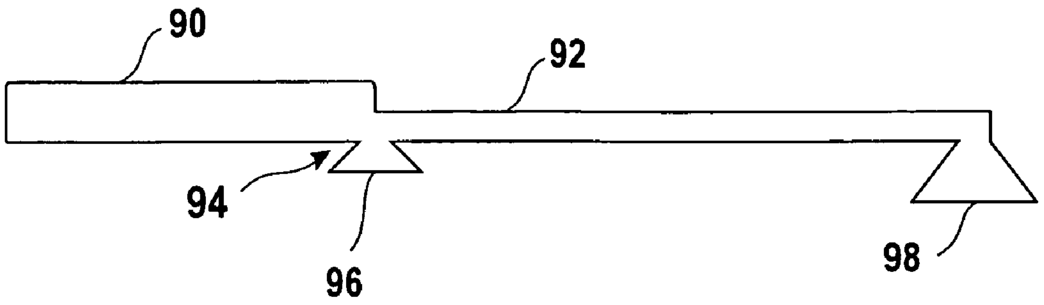
FIG. 8 is a simplified plan view showing the dimension of the transmission lines shown in FIG. 1 to implement the filter shown in FIG. 4, in accordance with the present invention.

Referring to FIG. 8, to that end, one example of segments 60-63 includes providing a copper trace 90 have a length of approximately 762 micrometers, a width of approximately 40 micrometers and a thickness of approximately 17 micrometers. Extending from trace 90 is a trace 92 with a length of approximately 18 micrometers, a width of approximately 20 micrometers and a thickness of approximately 17 micrometers. Extending from a junction 94 of traces 90 and 92 is a triangular portion 96, the sides of which have a common length, e.g., 50 micrometers. Disposed proximate to a terminus of trace 92, positioned opposite to junction 94 is a second triangular portion 98, the sides of which have a common length, e.g., 100 micrometers. In one embodiment, the angle of the sides of the triangular portions 96 and 98 with the bottom of traces 90 and 92 is about 60 degrees. It is possible to form the features 90, 92, 94, 96 and 98 to have larger sizes, e.g., when formed on a PCB; however, it is desired that the aforementioned ratios of dimensions be substantially maintained. Additionally, it is possible to fabricate vias 14 to provide the function provided by features 92, 94, 96 and 98, in lieu of conductive transmission lines 18, 19, 20 and 21 or, alternatively, in conjunction therewith. Thus, the traces can be implemented in a horizontal and vertical direction.

Although the foregoing invention has been described in some detail for purposes of clarity of understanding, it will be apparent that certain changes and modifications may be practiced within the scope of the appended claims. Accordingly, the present embodiments described above are to be considered as illustrative and not restrictive, and the invention is not to be limited to the details given herein, but may defined by the appended claims, including full scope of equivalents thereof.

What is claimed is:

1. A transmission line assembly comprising:

a plurality of spaced-apart electrically conductive traces on a substrate, with a subset of the plurality of spaced apart electrically conductive traces having dimensions to filter unwanted characteristics of signals propagating through the electrically conductive traces and inductively coupled between one or more of the plurality of spaced-apart electrically conductive traces, the signals propagating though the electrically conductive traces defining inductively coupled signals, wherein the electrically conductive traces of the subset are configured as a first copper trace joined to a second copper trace through a triangular copper portion and wherein the first copper trace is wider than the second copper trace.

2. The transmission line assembly as recited in claim 1 wherein the dimensions of the electrically conductive traces of the subset are configured to function as one of a Bessel filter or a Chebyshev filter.

3. The transmission line assembly as recited in claim 1 wherein the substrate is a printed circuit board and wherein the second copper trace has another triangular copper portion attached to a terminus of the second copper trace.

4. The transmission line assembly as recited in claim 1 wherein the dimensions of the electrically conductive traces of the subset are configured to provide filtering properties, with the filtering properties being a function of a coupling component representing inductively coupling characteristics of the inductively coupled signals and a time varying current of the inductively coupled signals when alternating between voltage levels associated with a logical "1" and a logical "0".

5. The transmission line assembly as recited in claim 1 wherein the dimensions of the electrically conductive traces of the subset are configured to provide filtering properties, with the filtering properties including a reduction in a bandwidth of the inductively coupled signals.

6. The transmission line assembly as recited in claim 1 wherein the dimensions of the electrically conductive traces of the subset are configured to provide filtering properties, with the filtering properties including a reduction in a bandwidth and magnitude of the inductively coupled signals.

7. The transmission line assembly as recited in claim 1 wherein the dimensions of the electrically conductive traces of the subset are configured to provide filtering properties, with the filtering properties including a reduction in a magnitude of the inductively coupled signals to be less than a voltage threshold associated with integrated circuits coupled to the electrically conductive traces.

8. The transmission line assembly as recited in claim 1 wherein the dimensions of the electrically conductive traces of the subset are configured to provide filtering properties, with the filtering properties including a reduction in a bandwidth and magnitude of the inductively coupled signals, with the magnitude being less than a voltage threshold associated with integrated circuits coupled to the electrically conductive traces.

9. A transmission line assembly comprising:

a plurality of spaced-apart electrically conductive traces on a substrate, with a subset of the plurality of spaced apart electrically conductive traces having dimensions to function as a Bessel filter and attenuate unwanted characteristics of signals propagating through the electrically conductive traces and inductively coupled between two or more of the plurality of spaced-apart electrically conductive traces, wherein at least one of the electrically conductive traces are configured as a first copper trace joined to a second copper trace through a triangular copper portion and wherein the first copper trace is wider than the second copper trace.

10. The transmission line assembly as recited in claim 9 wherein the substrate is disposed on a printed circuit board.

11. The transmission line assembly as recited in claim 9 wherein the unwanted characteristics includes a bandwidth of the inductively coupled signals.

12. The transmission line assembly as recited in claim 9 wherein the unwanted characteristics includes a bandwidth and magnitude of the inductively coupled signals.

13. The transmission line assembly as recited in claim 9 wherein the unwanted characteristics includes a bandwidth and a magnitude of the inductively coupled signals, with the magnitude being less than a voltage threshold associated with integrated circuits coupled to the electrically conductive traces.

14. The transmission line assembly as recited in claim 13 wherein the dimensions of the electrically conductive traces of the subset are configured to provide filtering properties, with the filtering properties being a function of a coupling component representing inductive coupling characteristics of the inductively coupled signals and a time varying current of the inductively coupled signals when alternating between voltage levels associated with a logical "1" and a logical "0".

15. A method of filtering signals propagating through a plurality of spaced-apart electrically conductive traces on a substrate and inductively coupled between two or more of the plurality of spaced-apart electrically conductive traces, the method comprising:

forming the electrically conductive traces with dimensions to provide desired filtering properties and attenuate unwanted characteristics of the inductively coupled signals, the forming further including providing the electrically conductive traces wherein at least one of the electrically conductive traces are configured as a first copper trace joined to a second copper trace through a triangular copper portion and wherein the first copper trace is wider than the second copper trace.

16. The method as recited in claim 15 wherein the forming further includes providing the electrically conductive traces with properties of one of a Bessel filter or a Chebyshev filter.

17. The method as recited in claim 15 wherein the unwanted characteristics include a frequency bandwidth and a magnitude of the inductively coupled signals.

18. The method as recited in claim 17 wherein of the inductively coupled signals is attenuated the magnitude to be less than a voltage threshold associated with integrated circuits coupled to the electrically conductive traces.

* * * * *